United States Patent
Matsuo et al.

(10) Patent No.: US 6,943,549 B2
(45) Date of Patent: Sep. 13, 2005

(54) METHOD FOR PROCESSING MAGNETIC RESONANCE IMAGING IMAGE INFORMATION AND MAGNETIC RESONANCE IMAGING SYSTEM

(75) Inventors: Masahiko Matsuo, Fukuoka (JP); Hideo Eda, Tokyo (JP); Satoru Miyauchi, Tokyo (JP)

(73) Assignee: National Institute of Information and Communications Technology Incorporated Administrative Agency, Tokyo (JP)

( * ) Notice: Subject to any disclaimer, the term of this patent is extended or adjusted under 35 U.S.C. 154(b) by 0 days.

(21) Appl. No.: 10/679,343

(22) Filed: Oct. 7, 2003

(65) Prior Publication Data

US 2004/0150399 A1 Aug. 5, 2004

(30) Foreign Application Priority Data

Oct. 11, 2002 (JP) .................................... 2002-298642

(51) Int. Cl.$^7$ ...................... G01V 3/00; A61B 5/055; G06K 9/36
(52) U.S. Cl. ...................... 324/309; 324/318; 382/131; 600/410
(58) Field of Search ...................... 382/132, 128, 382/199, 190, 172; 324/309, 318; 600/410, 407

(56) References Cited

U.S. PATENT DOCUMENTS

| | | | | |
|---|---|---|---|---|
| 5,974,165 A | * | 10/1999 | Giger et al. | 382/132 |
| 6,278,891 B1 | * | 8/2001 | Reiderman et al. | 600/410 |
| 6,285,901 B1 | * | 9/2001 | Taicher et al. | 600/410 |
| 6,799,066 B2 | * | 9/2004 | Steines et al. | 600/407 |
| 2004/0150399 A1 | * | 8/2004 | Matsuo et al. | 324/309 |

OTHER PUBLICATIONS

Matsuo et al., English translation of article "Research of Structural Image Process for Optical Brain Function Measurement" (May 2002) p. 55.*

Masahiko Matsuo et al., "Research of Structural Image Process for Optical Brain Function Measurement," Proc. of Japan Soc. ME & BE Conference, May 2002, pp. 55.

* cited by examiner

Primary Examiner—Brij Shrivastav
Assistant Examiner—Tiffany A. Fetzner
(74) Attorney, Agent, or Firm—Banner & Witcoff Ltd.

(57) ABSTRACT

A method for processing magnetic resonance imaging image information is characterized by that a magnetic resonance spectral intensity value is measured at each of a plurality of measuring points that are arranged at predetermined intervals along a lengthwise direction, a crosswise direction and a height direction on an object to be measured and several kinds of magnetic resonance imaging image information as a set of the magnetic resonance spectral intensity values measured at the measuring point are obtained by a plurality of different spectral intensity measuring methods with respect to the object to be measured, a magnetic resonance spectral intensity value at the predetermined position is obtained directly or indirectly from a measured results of the magnetic resonance spectral intensity values that is included in the magnetic resonance imaging image information and the predetermined position is set to be identical for all of the several varieties of magnetic resonance imaging image information with respect to each of the magnetic resonance imaging image information, and new image information at the predetermined position is derived by linear calculation between the spectral intensity values.

9 Claims, 8 Drawing Sheets

Fig.3

| First piece | First row | Second row | Third row | Fourth row | Fifth row | ... | 256th row |
|---|---|---|---|---|---|---|---|
| First column | 0 | 0 | 0 | 0 | 512 | ... | 0 |
| Second column | 0 | 0 | 0 | 0 | 511 | ... | 0 |
| Third column | 0 | 0 | 0 | 523 | 542 | ... | 0 |
| Fourth column | 0 | 0 | 0 | 498 | 538 | ... | 0 |
| Fifth column | 0 | 0 | 425 | 550 | 635 | ... | 0 |
| ... | ... | ... | ... | ... | ... | ... | ... |
| 256th column | 0 | 0 | 0 | 0 | 439 | ... | 0 |
| Second piece First column | 0 | 0 | 0 | 0 | 653 | ... | 0 |
| ... | ... | ... | ... | ... | ... | ... | ... |

Fig.4

| | T₁ MEASUREMENT SIGNAL | T₂ MEASUREMENT SIGNAL | HYDROGEN NUCLEUS DENSITY MEASUREMENT SIGNAL |
|---|---|---|---|
| WATER | LOW | HIGH | HIGH |
| BONE | LOW | LOW | LOW |
| BRAIN | MIDDLE AND HIGHISH | MIDDLE | HIGHISH |
| SKIN | MIDDLE | HIGHISH | HIGHISH |

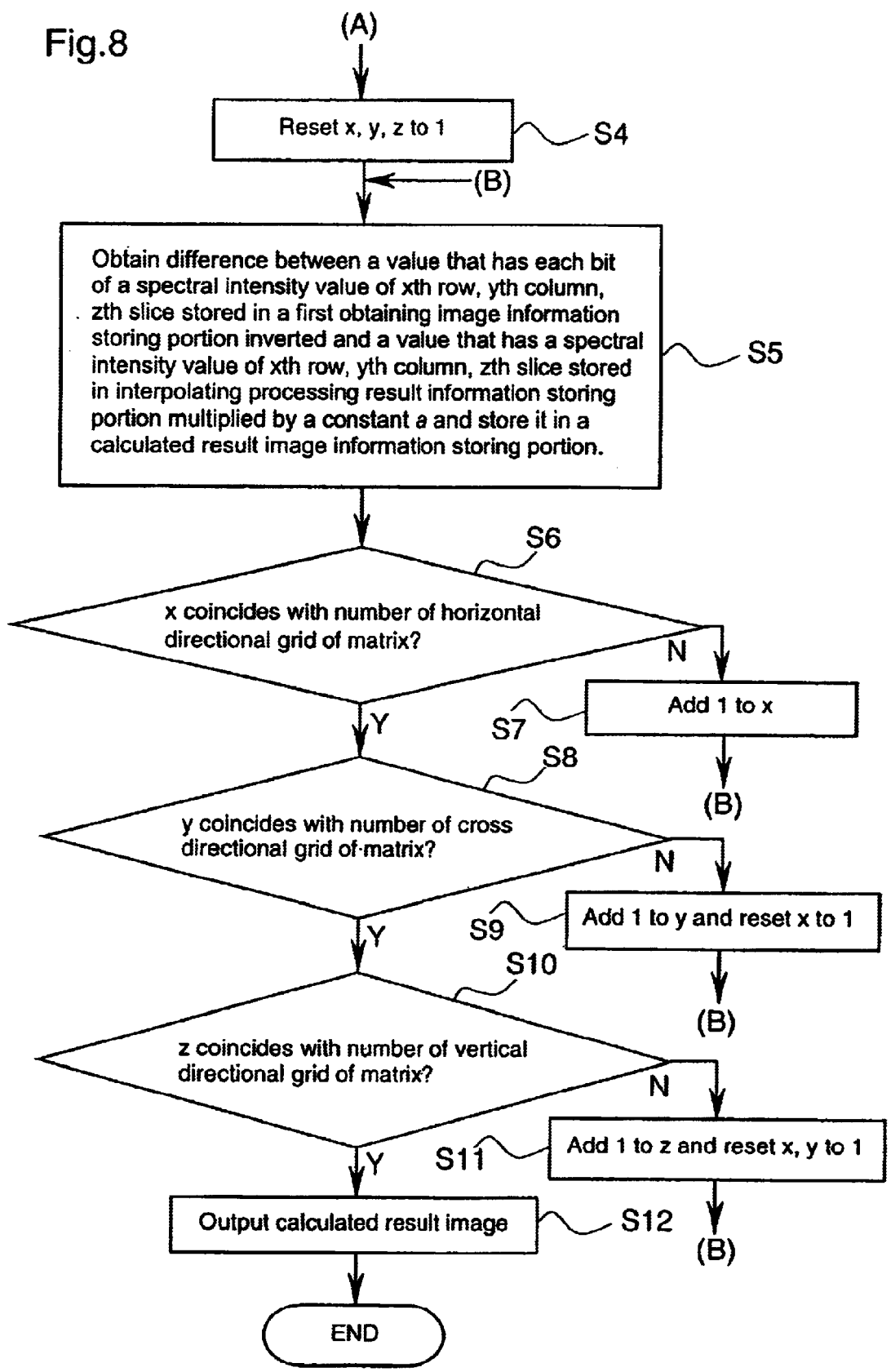

METHOD FOR PROCESSING MAGNETIC RESONANCE IMAGING IMAGE INFORMATION AND MAGNETIC RESONANCE IMAGING SYSTEM

CROSS REFERENCE TO RELATED APPLICATIONS

This application is based upon and claims the benefit of priority from the prior Japan Patent Application No. P2002-298642, filed Oct. 11, 2002, the entire contents of which are incorporated herein by reference.

BACKGROUND OF THE INVENTION AND RELATED ART STATEMENT

This invention relates to a method for processing magnetic resonance imaging image information that is preferably used for a nondestructive inspection of an internal structure of a three-dimensional object such as a human body and also relates to a magnetic resonance imaging system used in the method.

Conventionally, X-ray photography has been widely used for inspecting an internal structure of a human body. The X-ray irradiating a human body transmits an image of the human body, however, transmittance becomes low in bones. Then fracture of the bone can be diagnosed with an X-ray photograph.

However, there is a problem that X-rays cannot irradiate often on a human body because an enormous quantity of X-rays irradiated on a human body will damage cellular of the human body. In order to solve this problem, an approach has been made that a magnetic field is irradiated on a human body so as to inspect an internal structure of the human body with magnetic resonance spectral intensity distribution by making use of a magnetic resonance phenomenon. "Research of Structural Image Process for Optical Brain Function Measurement" by Masahiko Matuo, Hirofumi Hamada, Naohiro Fujikawa, Hideaki Ninomiya, Hideo Eda and Satoru Miyauchi, p55 of the Proceedings of Japan Soc. ME & BB Conference (May, 2002).

However, when an ordinary magnetic resonance imaging (MRI) image cannot be obtained for some portions of the human body such as a bone structure, then a new method is needed to inspect such portions by a nondestructive inspection.

In order to solve the above problems the present claimed invention intends to provide a new method for a nondestructive inspection on an internal three-dimensional object without harmful electromagnetic waves such as radioactive rays.

SUMMARY OF THE INVENTION

The method for processing magnetic resonance imaging image information in accordance with the present claimed invention is characterized by that a magnetic resonance spectral intensity value is measured at each of a plurality of measuring points that are arranged at predetermined intervals along a lengthwise direction, a crosswise direction and a height direction on an object to be measured while several kinds of magnetic resonance imaging image information are obtained as a set of the magnetic resonance spectral intensity values measured at the plurality of measuring points obtained by a plurality of different spectral intensity measuring methods (T1,T2) with respect to the object to be measured. A magnetic resonance spectral intensity value at a predetermined position is obtained directly (i.e by measurement) or indirectly (i.e. by interpolation) from the measured results of the magnetic resonance spectral intensity values using two kinds of spectral intensity measuring methods respectively with respect to the bone structure to be measured, the spectral intensity measuring methods comprising: a magnetic longitudinal relaxation (T1) measurement and a magnetic transverse relaxation (T2) measurement; three-dimensionally aligning the magnetic resonance imaging (MRI) image information obtained by the magnetic longitudinal relaxation (T1) measurement with the magnetic resonance imaging (MRI) image information obtained by the magnetic transverse relaxation (T2) measurement and obtaining by interpolation another set of spectral intensity values of the magnetic resonance imaging image information for both the magnetic longitudinal relaxation (T1) measurement and the magnetic resonance imaging image information by the magnetic transverse relaxation (T2) measurement, at the same points as the plurality of measuring points used for said predetermined intervals along a lengthwise direction, a crosswise direction and a height direction on said bone structure, and deriving information showing the bone structure as new image information by performing a linear calculation between the set of spectral intensity values obtained by the magnetic longitudinal relaxation (T1) measurement and the set of spectral intensity values obtained by the magnetic transverse relaxation (T2) measurement at each of the plurality of measuring points that are arranged at said predetermined intervals along a lengthwise direction a crosswise direction and a height direction on said bone structure.

In accordance with the method, if we focus attention on, for example, that a magnetic longitudinal relaxation velocity of hydrogen nucleus in a water molecule is low and a magnetic transverse relaxation velocity thereof is high, it is possible to inspect the inside of an object to be measured in a nondestructive manner without irradiating harmful X-rays such as to derive an image of a bone structure by eliminating a spectrum originating from a hydrogen nucleus in a water molecule by obtaining a magnetic resonance imaging (MRI) image of a magnetic longitudinal relaxation (T1) measurement and a magnetic resonance imaging image of a magnetic transverse relaxation (T2) measurement conducted on a living organism.

A preferable mode to conduct an inspection by magnetic resonance imaging (MRI) is to form an new MRI image of a bone structure.

As an example of the method to conduct the MRI inspection by magnetic resonance imaging is to obtain a magnetic longitudinal relaxation (T1) measurement and a magnetic transverse relaxation (T2) measurement.

Further, as another example of the method to conduct the MRI inspection is to obtain a nuclear density measurement in addition to the T1 and T2.

When the magnetic resonance imaging image is obtained, a measuring position is often set at different positions according to a kind of measurement. Then in order to obtain spectral intensity values at an identical predetermined position by several different measurements, it is preferable that with respect to at least one kind of the magnetic resonance imaging image information, the magnetic resonance spectral intensity values at the predetermined positions are obtained by interpolation of the measured results of the magnetic resonance spectral intensity values that are included in the magnetic resonance imaging image information. In accordance with the arrangement, for example, measuring points of a kind of magnetic resonance imaging image information are set at a plurality of predetermined positions and other magnetic resonance imaging image information is obtained from magnetic resonance spectral intensity of the magnetic resonance imaging image information at the same predetermined positions by interpolation of magnetic resonance spectral intensity values of the other magnetic resonance imaging image information at the same predetermined positions, which makes it possible to obtain new MRI image information with ease.

In order to obtain the magnetic resonance imaging image with ease, it is preferable that each of the magnetic resonance spectral intensity values is a hydrogen nucleus magnetic resonance spectral intensity value. This is because a lot of hydrogen atoms are included in a living body and sensitivity of nucleus magnetic resonance of hydrogen atom is high compared with most of other nuclei.

Further, in order to obtain a condition of a bone more accurately, it is preferable that a comparison is further made between the new MRI image information obtained by a linear calculation of the spectral intensity values at each of the predetermined positions and image information obtained by a respective X-ray computed tomography. It is also possible to obtain image data showing a position and/or a condition of a bone directly when the X-ray computed tomography is used. In the present claimed invention "a comparison is further made between new image information obtained by a linear calculation of the spectral intensity values at the predetermined positions and image information obtained by an X-ray computed tomography" which is a concept including that the image information is output simultaneously on both a display and a printing media such as a paper so as to make the image information visible, based on the image information and a linear calculation is made between a special intensity values of the image information at the predetermined position so as to derive further new information.

As a magnetic resonance imaging system that is used in the method for processing magnetic resonance imaging image information it is preferable that the system functionally comprises at least an information obtaining portion that obtains magnetic resonance imaging image information, a first obtained image information storing portion that stores magnetic resonance imaging image information obtained by a predetermined method, a second obtained image information storing portion that stores magnetic resonance imaging image information obtained by a method different from the predetermined method, a linear calculation portion that conducts a linear calculation based on the magnetic resonance imaging image information stored in the first obtained image information storing portion and the magnetic resonance imaging image information stored in the second obtained image information storing portion, a calculated result image information storing portion that stores new image information as a calculated result of the linear calculation portion and an image output portion that outputs an image based on the image information stored in the calculated result image information storing portion.

In addition the MRI system processing also functions as an interpolating calculation portion that three-dimensionally aligns the magnetic resonance imaging image information stored in the first obtained image information storing portion with the magnetic resonance imaging image information stored in the second obtained image information storing portion and spectral intensity values at the predetermined positions which are set identical to other measuring points obtained by interpolation of the magnetic resonance imaging image information stored in either one of the first and the second obtained image information storing portions. It is also possible to obtain a spectral intensity values at the same predetermined positions and to make an individual linear calculation even though a measuring point varies between the magnetic resonance imaging image information stored in the first obtaining image information storing portion and the magnetic resonance imaging image information stored in the second obtaining image information storing portion.

BRIEF DESCRIPTION OF THE DRAWINGS

FIG. 3 is a general view showing a stored state of magnetic resonance imaging image information obtained by the MRI system in accordance with the embodiment.

FIG. 4 is a view showing a tendency of signal intensity value of each portion of the image obtained by the MRI system in accordance with the embodiment.

FIG. 8 is a flow chart showing a flow of a step in the method for processing magnetic resonance imaging image information in accordance with the embodiment.

DETAILED DESCRIPTION OF THE PREFERRED EMBODIMENTS

An embodiment of the present claimed invention will be described in detail with reference to the accompanying drawings.

Figure 1:
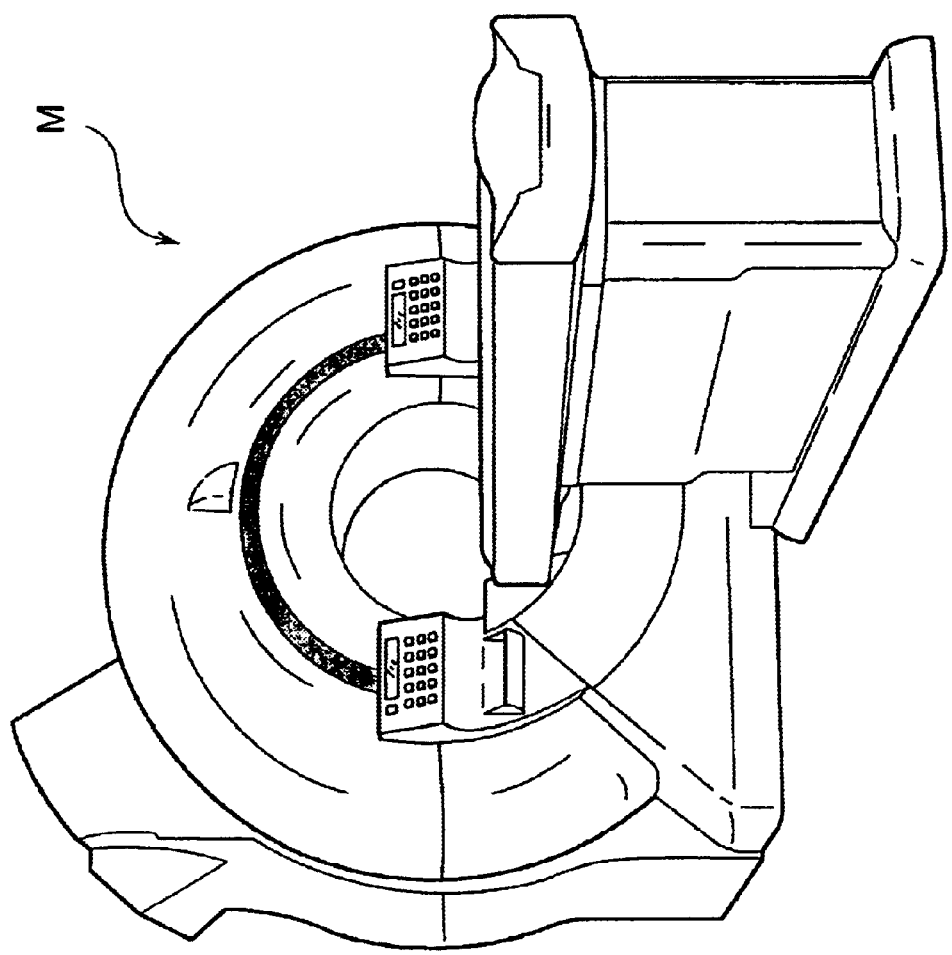
FIG. 1 is a general view showing an MRI system used in a method for processing magnetic resonance imaging image information in accordance with one embodiment of the present claimed invention.

A method for processing magnetic resonance imaging image information in accordance with the embodiment uses a magnetic resonance imaging system (hereinafter called as MRI system) $\underline{M}$ shown in FIG. 1. Magnetic resonance imaging image information by a magnetic longitudinal relaxation measurement (hereinafter called as $T_1$ measurement) and magnetic resonance imaging image information by a magnetic transverse relaxation measurement (hereinafter called as $T_2$ measurement) are obtained with the MRI system $\underline{M}$.

The MRI system $\underline{M}$ has the same arrangement as that of a universally known and widely used system for a medical checkup and acts the same so as to obtain the magnetic resonance imaging image information by the $T_1$ measurement and the magnetic resonance imaging image information by the $T_2$ measurement. In this embodiment, an x axis is set along a horizontal direction of a human body, a y axis is set along a cross direction thereof and a z axis is set along a vertical direction thereof and an x-y plane is a sliced image plane on which a matrix is set. Measuring points are set at a same pitch along the horizontal direction and the cross direction of the body of a subject as an object to be measured, namely, along the x axis and the y axis with a same matrix score.

Figure 2:
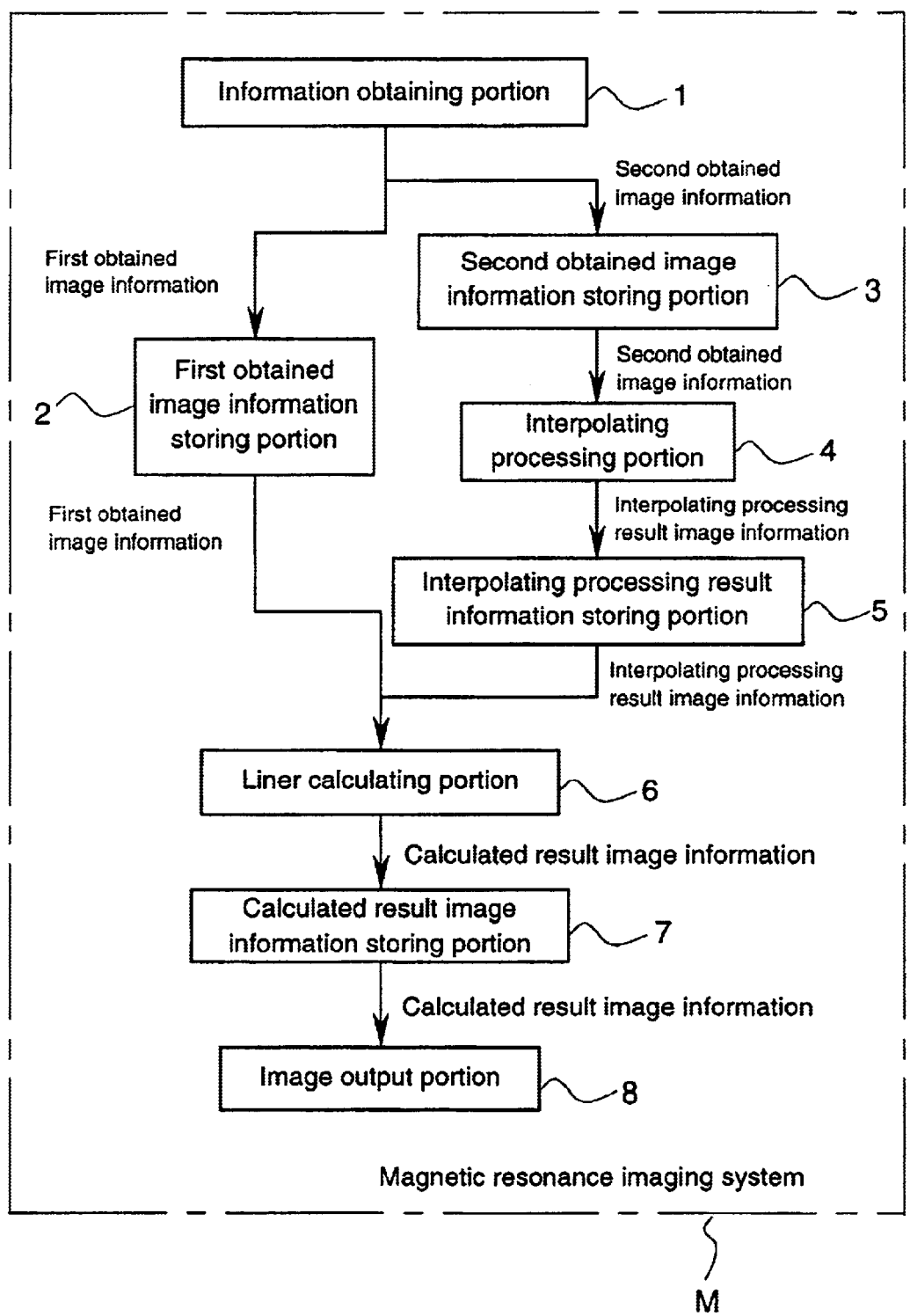
FIG. 2 is a functional block diagram of the MRI system in accordance with the embodiment.
Figure 5:
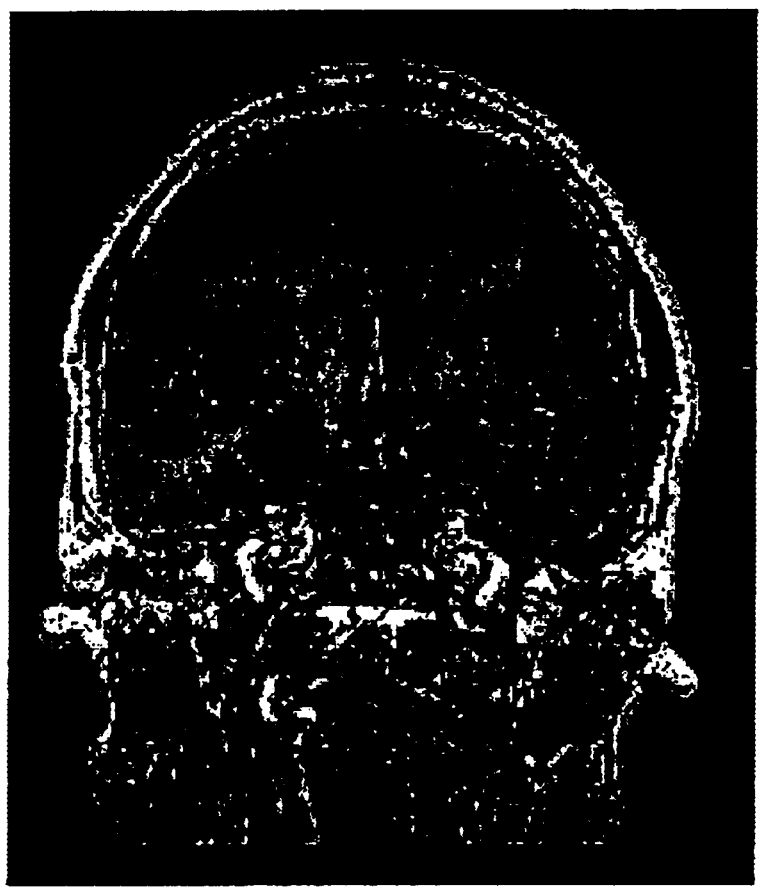
FIG. 5 is a view showing an example of the image obtained with a magnetic longitudinal relaxation measurement by the MRI system in accordance with the embodiment.
Figure 6:
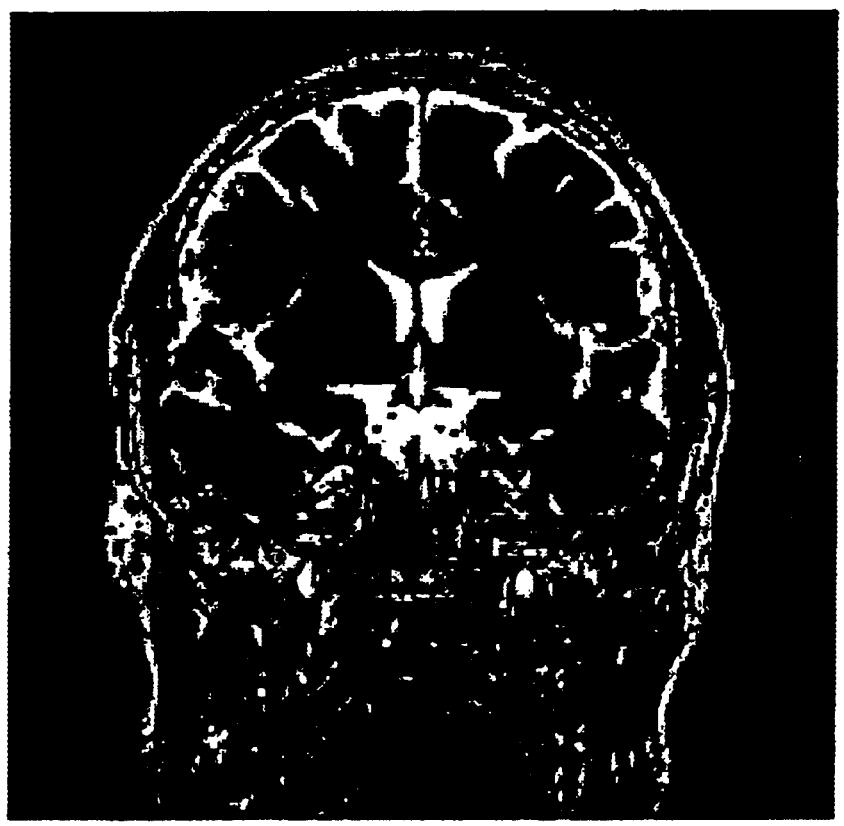
FIG. 6 is a view showing an example of the image obtained with a magnetic transverse relaxation measurement by the MRI system in accordance with the embodiment.

The MRI system $\underline{M}$, whose functional block diagram is shown in FIG. 2, functions as an information obtaining portion 1 that obtains the magnetic resonance imaging image information, a first obtained image information storing portion 2 that stores the magnetic resonance imaging image information obtained by the $T_1$ measurement, a second obtained image information storing portion 3 that stores the magnetic resonance imaging image information obtained by the $T_2$ measurement, and an image output portion 8 that outputs an image. The first obtained image information storing portion 2 and the second obtained image information storing portion 3 are arranged in a memory space of an internal memory of the MRI system M. The obtained magnetic resonance imaging image information is, as shown in FIG. 3, stored in the first obtained image information storing portion 2 and the second obtained image information storing portion 3. More specifically, a spectral intensity value at each point is indicated on a basis of 16-bit (65536) with the minimum of 0 and the maximum of 65535 and a spectral intensity value at a matrix point (x,y) on a sliced image plane of the z th slice is stored in the x th row and the y th column on the z th slice. The spectral intensity value of water is low by the $T_1$ measurement and high by the $T_2$ measurement. The spectral intensity value of a bone is low by both the $T_1$ measurement and the $T_2$ measurement. The spectral intensity value of a brain is midway between both the $T_1$ measurement and the $T_2$ measurement, however, the spectral intensity value of a brain is higher than the $T_1$ measurement. The spectral intensity value of skin is midway between the $T_1$ measurement and a higher $T_2$ measurement. The above-mentioned tendency is shown in FIG. 4. An example of the image obtained by the $T_1$ measurement is shown in FIG. 5 and an example of the image obtained by the $T_2$ measurement is shown in FIG. 6 respectively.

In this embodiment, the spectral intensity value of the magnetic resonance imaging image information obtained by the $T_1$ measurement and the spectral intensity value of the magnetic resonance imaging image information obtained by the $T_2$ measurement at the same position are linear-calculated so as to obtain image information showing a bone structure of a head portion.

Figure 7:
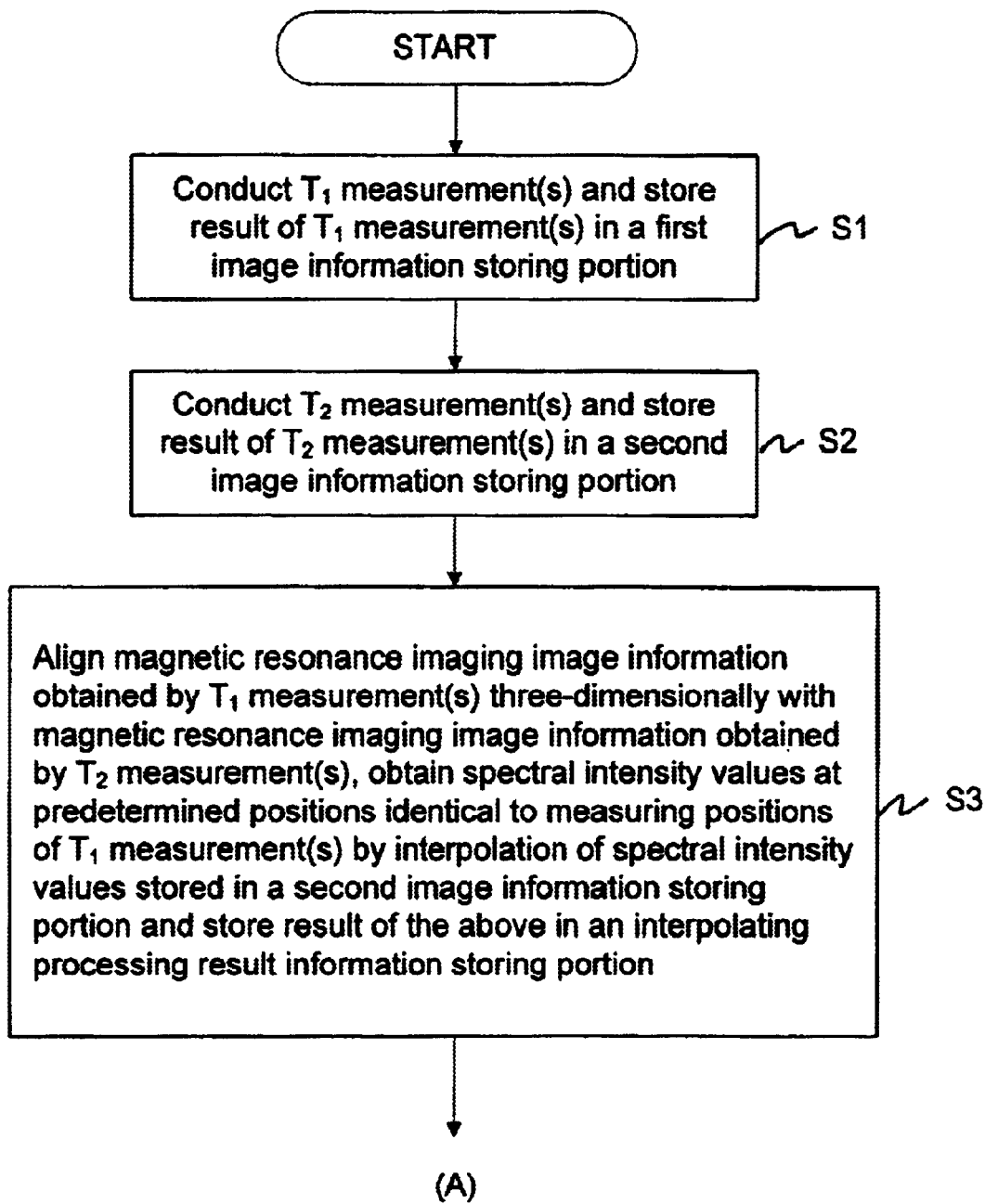
FIG. 7 is a flow chart showing a flow of a step in the method for processing magnetic resonance imaging image information in accordance with the embodiment.

More specifically, as shown in FIG. 2, the MRI system M further functions as an interpolating processing portion 4, an interpolating processing result information storing portion 5, a linear calculating portion 6 and a calculated result image information storing portion 7. The interpolating processing result information storing portion 5 and the calculated result image information storing portion 7 are arranged in the memory space. The interpolating processing portion 4 three-dimensionally aligns the magnetic resonance imaging image information obtained by the $T_1$ measurement(s) and the magnetic resonance imaging image information obtained by the $T_2$ measurement(s) and aligns a spectral intensity value at the same corresponding points as the measured points used for the $T_1$ measurement(s) by interpolation of the magnetic resonance imaging image information obtained by the respective $T_2$ measurement(s). The interpolating processing result information storing portion 5 stores a calculated result by the interpolating processing portion 4. The linear calculating portion 6 inverts each bit of the spectral intensity value stored in the first obtained image information storing portion 2 and also calculates difference between the inverted result and the spectral intensity value stored in the interpolating processing result information storing portion 5 multiplied by a constant number a. The constant number a is so set that a calculated result of a spectral intensity value of water is zero. The calculated result image information storing portion 7 stores calculated result image information as a set of the calculated results. A flow of concrete steps is shown below with reference to FIG. 7 and FIG. 8. First, the information obtaining portion 1 conducts the $T_1$ measurement and a result of the $T_1$ measurement is stored in the first obtained image information storing portion 2. (S1) Next, the information obtaining portion 1 conducts the $T_2$ measurement and a result of the $T_2$ measurement is stored in the first obtained image information storing portion 2. (S2) The magnetic resonance imaging image information obtained by the $T_1$ measurement and the magnetic resonance imaging image information obtained by the $T_2$ measurement and three-dimensionally aligned, a spectral intensity value at the same point as the measured point used for the $T_1$ measurement is obtained by interpolation of the magnetic resonance imaging image information obtained by the $T_2$ measurement and then the obtained spectral intensity value is stored in the interpolating processing result information storing portion 5. (S3) More concretely, as mentioned above, since a size of each matrix is the same and a width between adjacent sliced image planes is made broad, a spectral intensity value at a measuring point to be obtained is obtained by linear interpolation of spectral intensity values of the same grid in a matrix as that of the measuring point on the two sliced image planes nearest to the measuring point. The flow so far is shown in FIG. 7. As shown in FIG. 8, an x direction of the matrix, namely a variable x showing a row in FIG. 3, a y direction of the matrix, namely a variable y showing a column in FIG. 3 and a variable z showing a number of a sliced image plane are reset to 1. (S4) With respect to a signal intensity of the x th row, the y th column on the z th slice, a value that is a spectral intensity value of the x th row, the y th column on the z th slice stored in the interpolating processing result information storing portion 5 multiplied by a is subtracted from a value that has each bit of a spectral intensity value inverted of the x th row, the y th column on the z th slice stored in the first obtaining image information storing portion 2. (S5, a linear calculation step) More specifically, a linear calculation is conducted based on $t=(65535-t_1)-at_2$ wherein a spectral intensity value to be obtained is t, a spectral intensity value obtained by the $T_1$ measurement is $t_1$, and a spectral intensity value obtained by the $T_2$ measurement is $t_2$, and a calculated result is stored at the x th row, a y th column on the z th slice of the calculated result image information storing portion 7. It is determined whether the stored x coincides with a number of a grid of the matrix. (S6) If the x does not coincide with the number of the grid of the matrix, 1 is added to the x (S7) and return to the linear calculation step. If the x coincides with the number of the grid, it is determined whether the stored y coincides with a number of the grid of the matrix. (S8) If the y does not coincide with the number of the grid of the matrix, 1 is added to the y and the x is reset to 1 (S9) and return to the linear calculation step. If the y coincides with the number of the grid, it is determined whether the z coincides with a number of a slice of the sliced image. (S10) If the z does not coincide with the number of the slice, 1 is added to the z and the x and the y are reset to 1 (S11) and return to the linear calculation step. If the z coincides with a number of the sliced image planes, an image is output based on the image information stored in the calculation result image information storing portion 7 by the above steps. (S12)

In accordance with the above steps of obtaining image information, it is possible to obtain a data of a bone structure shape that cannot be obtained by an ordinary MRI measurement inspection without using radiation rays that is harmful to a human body. Especially, if the method for processing magnetic resonance imaging image information method is used for a head portion of a human, it is also possible to obtain a shape of a skull, which enables to determine a position of fracture of the skull more safely.

The present claimed invention is not limited to the above-described embodiment.

For example, magnetic resonance imaging spectral intensity image information by a hydrogen nucleus density measurement may be used. Further, spectral intensity values of three kinds of image information, namely magnetic resonance imaging image information by the hydrogen nucleus density measurement, magnetic resonance imaging image information by the magnetic longitudinal relaxation measurement and the magnetic resonance imaging image information by the magnetic transverse relaxation measurement at a predetermined positions may be linearly calculated so as to obtain new MRI image information. The spectral intensity values at each position by the hydrogen nucleus density measurement show a tendency different from the spectral intensity values at each position by the magnetic longitudinal relaxation measurement and by the magnetic transverse relaxation measurement, as shown in FIG. 4. When the spectral intensity value at each of the predetermined positions by the hydrogen nucleus density measurement is used as a variable of the linear calculation, further new information can be obtained.

The above-mentioned method for processing magnetic resonance imaging image information may be used to obtain information on a portion other than a bone structure of human. In this case, an algorithm of the linear calculation may be set arbitrarily tailored to a kind of information to be obtained.

Further, the predetermined position is not determined based on a measuring point of one kind of magnetic resonance imaging image information but may be determined independently from the measuring point of the magnetic resonance imaging image information obtained by the MRI system and the spectral intensity value at the predetermined position of all of the plurality of measuring points obtained from magnetic resonance imaging image information may be obtained by interpolation. In addition, an algorithm of interpolation which is different from the linear interpolation used in the above-described embodiment may be applied.

The magnetic resonance spectral nucleus may be another atomic nucleus such as a carbon nucleus or a nitrogen nucleus in addition to a hydrogen nucleus.

In addition, comparison may be made between image information obtained by the magnetic resonance imaging image information and image information obtained by a respective X-ray computed tomography image. More concretely, the image information obtained by the magnetic resonance imaging image information and the image information obtained by the X-ray computed tomography are either output simultaneously on a display and output to a printing media such as a paper so as to make the image information visible, or a linear calculation is made between a spectral intensity value of the image information obtained by the magnetic resonance imaging image information at a predetermined position and a spectral intensity value of the image information obtained by the X-ray computed tomography at the same predetermined position so as to derive further new image information. In accordance with the arrangement, a state of a bone can be obtained more accurately by comparing new MRI image information to the information directly showing a position of the bone by the respective X-ray computed tomography.

Other arrangements may be variously modified without departing from the spirit of the invention.

As mentioned above, since the present claimed invention derives new MRI image information showing an internal state of an object to be measured such as image information showing a bone structure by linear calculation of a plurality of magnetic resonance imaging image information, there is no need of nuclear radiation such as an X-ray that is harmful to a human body in order to conduct a non-destructive inspection on an inside of the object to be measured, thereby improving safety for a non-destructive inspection.

What is claimed is:

1. A method for processing magnetic resonance imaging image information wherein a magnetic resonance spectral intensity value is measured at each of a plurality of measuring points that are arranged at predetermined intervals along a lengthwise direction, a crosswise direction and a height direction on a bone structure to be measured, comprising obtaining magnetic resonance imaging (MRI) image information as a set of the magnetic resonance spectral intensity values measured at each of the plurality of measuring points that are arranged at predetermined intervals along a lengthwise direction, a crosswise direction and a height direction on said bone structure by using two kinds of spectral intensity measuring methods respectively with respect to the bone structure to be measured, the spectral intensity measuring methods comprising:

a magnetic longitudinal relaxation (T1) measurement and a magnetic transverse relaxation (T2) measurement;

three-dimensionally aligning the magnetic resonance imaging (MRI) image information obtained by the magnetic longitudinal relaxation (T1) measurement with the magnetic resonance imaging (MRI) image information obtained by the magnetic transverse relaxation (T2) measurement and obtaining by interpolation another set of spectral intensity values of the magnetic resonance imaging image information for both the magnetic longitudinal relaxation (T1) measurement and the magnetic resonance imaging image information by the magnetic transverse relaxation (T2) measurement, at the same points as the plurality of measuring points used for said predetermined intervals along a lengthwise direction, a crosswise direction and a height direction on said bone structure, and deriving information showing the bone structure as new MRI image information by performing a linear calculation between the set of spectral intensity values obtained by the magnetic longitudinal relaxation (T1) measurements and the set of spectral intensity values obtained by the magnetic transverse relaxation (T2) measurements at each of the plurality of measuring points that are arranged at said predetermined intervals along a lengthwise direction, a crosswise direction and a height direction on said bone structure.

2. The method for processing magnetic resonance imaging image information described in claim 1, wherein in said interpolating processing step each of the interpolated spectral intensity values obtained by the magnetic transverse relaxation (T2) measurement correspond to the same respective measuring points obtained by the magnetic longitudinal relaxation (T1) measurement.

3. The method for processing magnetic resonance imaging image information in claim 1 wherein the magnetic resonance spectral intensity values each correspond to a hydrogen nucleus magnetic resonance spectral intensity value.

4. The method for processing magnetic resonance imaging image information described in claim 1 further comprising obtaining magnetic resonance imaging image information by a nuclear density spectral intensity measurement method.

5. The method for processing magnetic resonance imaging image information described in claim 1, further comprising comparing the new MRI image information obtained by the linear calculation of the spectral intensity values at each of the corresponding measuring points as a respective image obtained by an X-ray computed tomography.

6. A magnetic resonance imaging system that is used in the method for processing magnetic resonance imaging image information described in claim 1, further comprising:

an information obtaining portion that obtains magnetic resonance imaging image (MRI) information from a living body by magnetic longitudinal relaxation (T1) measurement;

a first obtained image information-storing portion that stores the magnetic resonance imaging (MRI) image information obtained by the information-obtaining portion;

a second obtained image information-storing portion that stores magnetic resonance imaging image (MRI) information obtained from a living body by a magnetic transverses relaxation (T2) measurement;

an interpolating processing portion that three-dimensionally aligns the magnetic resonance imaging (MRI) image information stored in the first obtained image information-storing portion with the magnetic resonance imaging (MRI) image information stored in the second obtained image information-storing portion; and wherein the interpolating processing portion also obtains spectral intensity values with respect to each of the magnetic resonance imaging (MRI) image information measurements stored in the first obtained image information storing portion and the magnetic resonance imaging (MRI) image information measurements stored in the second obtained image information-storing portion at the same respective measuring points a linear calculation portion that conducts a linear calculation based on respective spectral intensity values at each of the measuring points;

a calculated result image information-storing portion that stores information showing a bone structure as a new image as a result of the linear calculation portion; and an image output portion that outputs the new image based on the image information stored in the calculated result image information-storing portion.

7. The magnetic resonance imaging system described in claim 6, further comprising a third obtained image information storing portion that stores magnetic resonance imaging spectral intensity image information obtained by a nuclear density measurement.

8. The magnetic resonance imaging system described in claim 6, wherein each of the magnetic resonance spectral intensity values each correspond to a hydrogen nucleus magnetic resonance spectral intensity value.

9. The magnetic resonance imaging system described in claim 6, further having a function of comparing between the linearly calculated new MRI image and a respective image obtained by an X-ray computed tomography.

* * * * *